United States Patent
Takahashi

(10) Patent No.: US 8,436,244 B2
(45) Date of Patent: May 7, 2013

(54) LAMINATED BUS BAR

(75) Inventor: Kiyoshi Takahashi, Hino (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 118 days.

(21) Appl. No.: 13/064,046

(22) Filed: Mar. 3, 2011

(65) Prior Publication Data
US 2011/0308834 A1 Dec. 22, 2011

(30) Foreign Application Priority Data

Jun. 18, 2010 (JP) ................ 2010-139730

(51) Int. Cl.
*H02G 5/00* (2006.01)
(52) U.S. Cl.
USPC ........ 174/68.2; 174/72 B; 174/71 B; 361/611
(58) Field of Classification Search .......... 361/611, 361/324, 37, 639, 648, 650, 775, 624; 174/68.2, 174/72 B, 71 B, 99 B, 149 B; 439/212, 213
See application file for complete search history.

(56) References Cited

U.S. PATENT DOCUMENTS

| | | | | |
|---|---|---|---|---|
| 6,255,722 B1 * | 7/2001 | Ewer et al. | | 257/676 |
| 6,379,193 B1 * | 4/2002 | Fujii et al. | | 439/680 |
| 6,667,547 B2 * | 12/2003 | Woodworth et al. | | 257/696 |
| 7,199,461 B2 * | 4/2007 | Son et al. | | 257/692 |

FOREIGN PATENT DOCUMENTS

| | | |
|---|---|---|
| JP | 2006-280191 | 10/2006 |
| JP | 2008-193779 | 8/2008 |
| JP | 2009-022062 | 1/2009 |

* cited by examiner

*Primary Examiner* — Angel R Estrada
*Assistant Examiner* — Dimary Lopez
(74) *Attorney, Agent, or Firm* — Manabu Kanesaka

(57) ABSTRACT

A laminated bus bar is applied to a main wiring circuit of an electric power converter and connected to a semiconductor module. The laminated bus bar includes insulator plates laminated together, and conductors interposed between the insulator plates. Each conductor includes a connection terminal section led out in accordance with an arrangement of a main circuit terminal on the semiconductor module. A creepage groove is formed on an edge of each of the insulator plates in accordance with a position between the connection terminal sections. The laminated bus bar facilitates elongation of the creepage distance between the connection terminals.

5 Claims, 9 Drawing Sheets

Expanded A Portion

LAMINATED BUS BAR

FIELD OF THE INVENTION

The present invention relates to laminated bus bars applied to a main wiring circuit in electric power converters and such apparatuses for connecting the main wiring circuit to a semiconductor module. Specifically, the invention relates to the insulation structure between the connection terminals of the laminated bus bar.

BACKGROUND

Recently, laminated bus bars have been employed very often in the electric power converters for the conductor in a main wiring circuit between a semiconductor module constituting an inverter section and a power supply for reducing the wiring inductance of the main wiring circuit. The laminated bus bar has a laminate structure formed by laminating conductors for the wiring circuit and insulator plates alternately into a sandwich-shaped unit (Patent Document 1).

As for the semiconductor module in the inverter section described above, the applicant of the present invention has proposed a four-in-one-type three-level IGBT (Insulated Gate Bipolar Transistor) module that includes four sets of semiconductor switching devices, each including an IGBT and an FWD (Free Wheeling Diode) connected in opposite parallel to each other. The four sets of the semiconductor switching devices are housed in a molded resin casing and put together in one package (Patent Document 2).

A conventional structure that employs a laminated bus bar in a main wiring circuit is shown in FIGS. 4(a) through 7 in connection with a single-phase inverter unit of an electric power converter formed of the four-in-one-type IGBT module disclosed in Patent Document 2.

FIG. 4(a) is an oblique view showing the assembly of an inverter unit. FIG. 4(b) is an expanded view of portion A in FIG. 4(a). FIG. 5 is a circuit diagram describing a phase (U phase) of the inverter unit. FIG. 6 is a perspective view showing the external appearance of the inverter unit. FIG. 7 is an enlarged view of the connection terminal section in the laminated bus bar having a conventional structure and employed in the inverter unit shown in FIG. 4(a).

In FIG. 4(a), three-level IGBT module 1, heat sink (radiator fin) 2, and laminated bus bar 3 are shown. Laminated bus bar 3 is wired between IGBT module 1 and filter capacitor (electrolytic capacitor) 4 for a DC power supply to connect IGBT module 1 and filter capacitor 4 to each other.

As shown in FIG. 5, IGBT module 1 is a four-in-one-type module that houses four sets of semiconductor switching devices T1 through T4 in a package. Each of switching devices T1 through T4 includes an IGBT and an FWD connected in opposite parallel to each other. Two sets of semiconductor switching devices T1 and T2 are connected in series to each other between the positive terminal P and the negative terminal N of a DC power supply such that an upper arm and a lower arm for one phase are formed. Two sets of semiconductor switching devices T3 and T4 are connected in opposite series to each other and, then, connected between the AC output terminal U and the neutral point terminal M such that a bidirectional switching circuit for clipping is formed.

The positive terminal P of IGBT module 1 and the neutral point terminal of capacitor 4 are connected to each other via conductor 3P. The negative terminal N of IGBT module 1 and the neutral point terminal of capacitor 4 are connected to each other via conductor 3N. The neutral point terminal M of IGBT module 1 and the neutral point terminal of capacitor 4 are connected to each other via conductor 3M. Since the operations of the three-level IGBT module and the functions of laminated bus bar 3 are described in detail in Patent Documents 1 and 2, their descriptions are not made here.

In FIG. 6 that illustrates the external appearance of the module, main circuit terminals (P, N, U, M) 7 of IGBT module 1 are aligned on convex terminal board 5a formed on the upper surface center of molded resin casing 5. Control terminals 8 such as gate terminals led out from the respective sets of switching devices T1 through T4 are spaced apart from main circuit terminals 7 and arranged on terminal board 5b formed on the side edge area of molded resin casing 5.

Now, the conventional structure of laminated bus bar 3 employed in the inverter unit described above and connected to inverter module 1 will be described below with reference to FIGS. 4(a), 4(b), and 7. Laminated bus bar 3 is a structure formed of plate-shaped conductors 3P, 3N, and 3M corresponding to the main wiring circuits shown in FIG. 5 and insulator plates 3a. Conductors 3P, 3N, and 3M and insulator plates 3a are laminated into a sandwich-shaped unit. Terminal sections connected to main circuit terminals 7 on IGBT module 1 are patterned as described below in respective conductors 3P, 3N, and 3M.

As described by portion A in FIG. 4(a), right and left concave terminal-leading-out-windows 3b are formed separately in the right-hand-side-portion and the left-hand-side-portion of insulator plates 3a in the end section of laminated bus bar 3 corresponding to terminal boards 5a of two IGBT modules 1, respectively. In accordance with the arrangement of main circuit terminals 7 of IGBT module 1, connection terminal sections 3P-1, 3N-1, and 3M-1 are led out into terminal-leading-out-window 3b. Through holes 3c for terminal screws (not-shown) bored through the connection terminal sections 3P-1, 3N-1, and 3M-1 are shown in FIG. 4(b). The led-out-sections of the conductors are bent appropriately in concave and in convex so that the central portions in the respective connection terminal sections of the conductors may be aligned in a plane.

In connecting laminated bus bar 3 to IGBT module 1, terminal-leading-out-windows 3b in laminated bus bar 3 are positioned on terminal boards 5a of IGBT modules 1 and connection terminal sections 3P-1, 3N-1, and 3M-1 of conductors 3P, 3N, and 3M and main circuit terminals 7 of IGBT modules 1 are joint to each other with terminals screws (not shown). Capacitors 4 are mounted on the far side of window 3b (the lower end side of laminated bus bar 3 in FIG. 4(a)) and connected between conductor 3M and conductors 3P and 3N.

Patent Document 1: Japanese Unexamined Patent Application Publication No. 2009-22062

Patent Document 2: Japanese Unexamined Patent Application Publication No. 2008-193779

The Standards of the Japan Electrical Manufacturers' Association (hereinafter referred to as the "JEM Standards") and the Standards of the International Electro-technical Commission (hereinafter referred to as the "IEC Standards") provide the domestic and international guidelines for the insulation performances of the electric equipment such as inverters. The JEM Standards and the IEC Standards specify the creepage distance and clearance distance for insulation corresponding to the kinds of the equipment, environments (degrees of contamination), and operating voltages. Especially, on the electric equipment for the rolling stock, the annex of the International Standard IEC 60077-1 (Railway applications—Electric equipment for rolling stock; hereinafter referred to simply as the "International Standard IEC 60077-1") specifies the insulation distances (creepage distance and clearance distance) as the persons skilled in the art well know.

As for the insulation, trenches 5a-1 are formed, as shown in FIG. 6, between main circuit terminals 7 and across terminal board 5a in the product of IGBT module 1 to secure the required creepage distance and clearance distance following the Standards described above. As for laminated bus bar 3 to be assembled to IGBT module 1, connection terminal sections 3P-1, 3N-1, and 3M-1 are led out from conductors 3P, 3N, and 3M to be connected to main circuit terminals 7 of IGBT module 1. Connection terminal sections 3P-1, 3N-1, and 3M-1 are led out from the spaces between insulator plates 3a and arranged in terminal-leading-out-window 3b in accordance with the arrangement pitch of main circuit terminals 7.

In the conventional laminated bus bar 3 structure (cf. FIG. 7), connection terminal sections 3P-1, 3N-1, and 3M-1 of the conductors sandwiched between insulator plates 3a are led out such that connection terminal sections 3P-1, 3N-1, and 3M-1 are separated from each other along the parallel edges of terminal-leading-out-window 3b cut linearly and extended in perpendicular to the linear edges of terminal-leading-out-window 3b. Therefore, the creepage distance between connection terminal sections 3P-1, 3N-1, and 3M-1 is the linear distance (the same with the clearance distance) along the cut edges of insulator plates 3a as schematically shown in FIG. 8.

However, the linear creepage distance is shorter than the creepage distance via the inner surface of trench 5a-1 formed between main circuit terminals 7 and across terminal board 5a on IGBT module 1 (cf. FIG. 6). Therefore, it is difficult for laminated bus bar 3 having the conventional structure to secure high insulation performances. If the inverter unit is applied to the electric power converters on the rolling stock, it will be difficult for laminated bus bar 3 having the conventional structure to follow the International Standard IEC60077-1 due to the shortage of the creepage distance between the connection terminal sections.

In view of the foregoing, it would be desirable to obviate the problems described above. It would be also desirable to provide a laminated bus bar that facilitates elongation of the creepage distance between the conductor terminals thereof by a few work applied to the insulator plates such that the creepage distance follows the International Standard and the insulation performances thereof are improved.

Further objects and advantages of the invention will be apparent from the following, description of the invention.

SUMMARY OF THE INVENTION

According to the first aspect of the invention, there is provided a laminated bus bar applied to the main wiring circuit of an electric power converter and connected to a semiconductor module, the laminated bus bar including a conductor and an insulator plate, the conductor being arranged between the insulator plates, the conductor including a connection terminal section, the connection terminal sections being led out in accordance with the arrangement of main circuit terminals on the semiconductor module. The laminated bus bar comprises a groove of creepage formed on the edge of the insulator plate, the grooves of creepage being formed in accordance with the positions between the connection terminal sections.

According to the second aspect of the invention, the groove of creepage is parallel-sided, and the groove of creepage has an opening width set to be equal to or more than 2.5 mm wide.

According to the structure described above, the creepage distance between the connection terminal sections separated from each other along the edges of the insulator plates and led out in perpendicular to the edges of the insulator plates is elongated for the groove of creepage formed additionally as compared with the creepage distance in the conventional structure, in which the insulator plate edge is linear. By setting the width of the groove of creepage to be equal to or more than 2.5 mm wide, the creepage distance that follows the International Standard IEC60077-1 is obtained and the insulation performances of the laminated bus bar are improved. Therefore, the laminated bus bar according to the invention is applicable to the electric power converters for the rolling stock.

BRIEF DESCRIPTIONS OF THE DRAWINGS

DETAILED DESCRIPTION OF THE INVENTION

Figure 5:
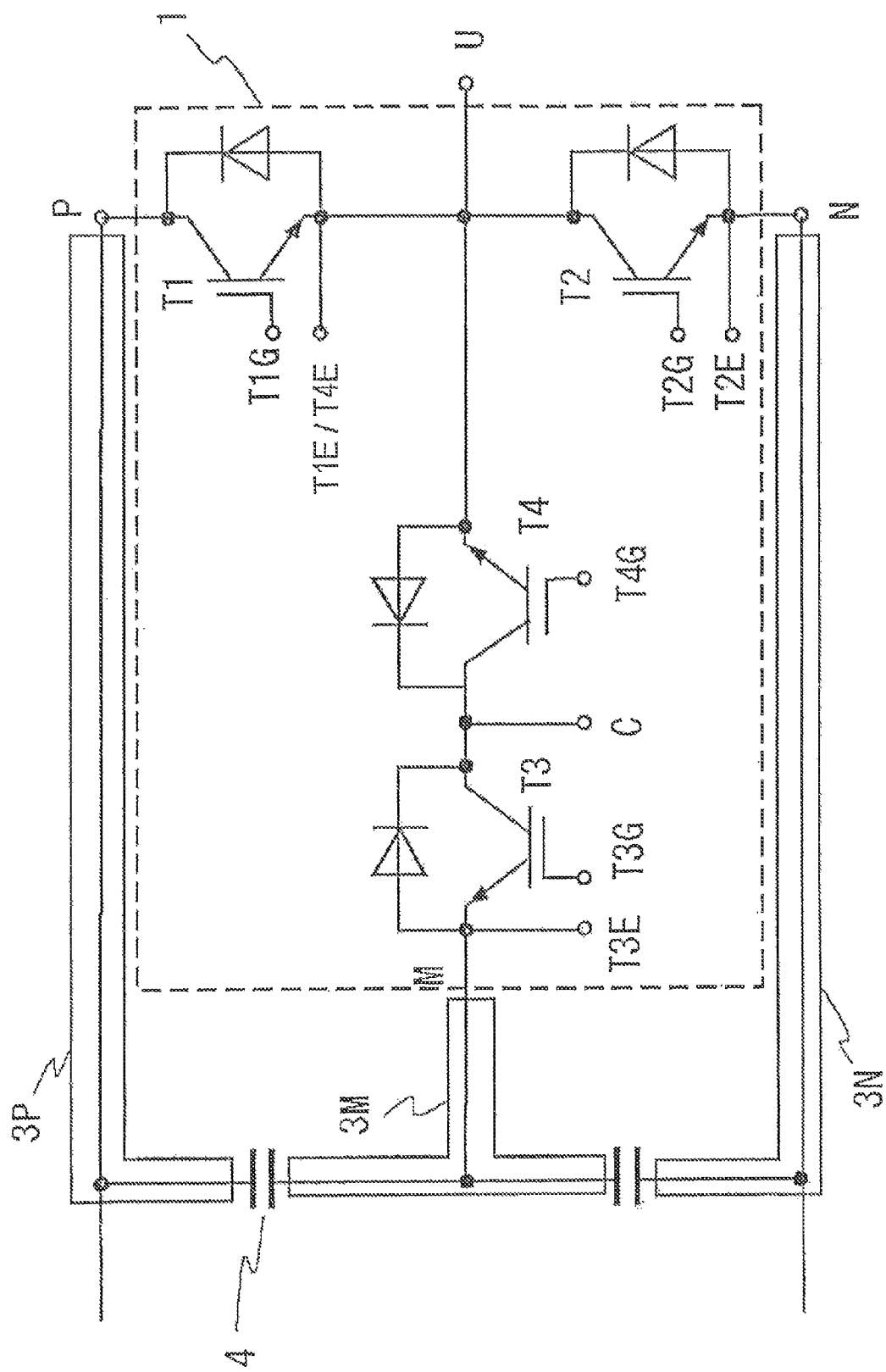
FIG. 5 is a circuit diagram describing a phase (U phase) of the inverter unit.
Figure 6:
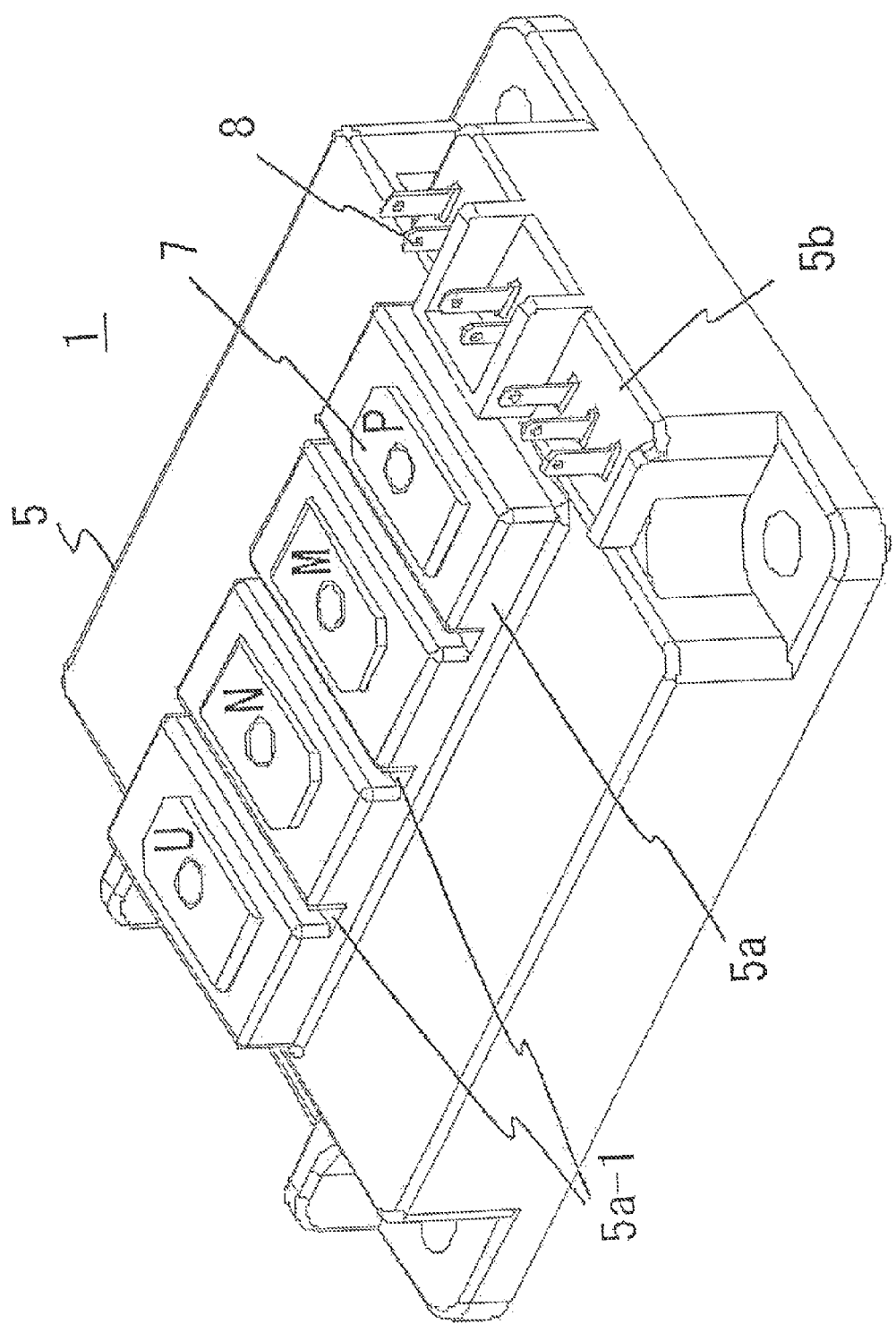
FIG. 6 is a perspective view showing the external appearance of the inverter module.
Figure 7:
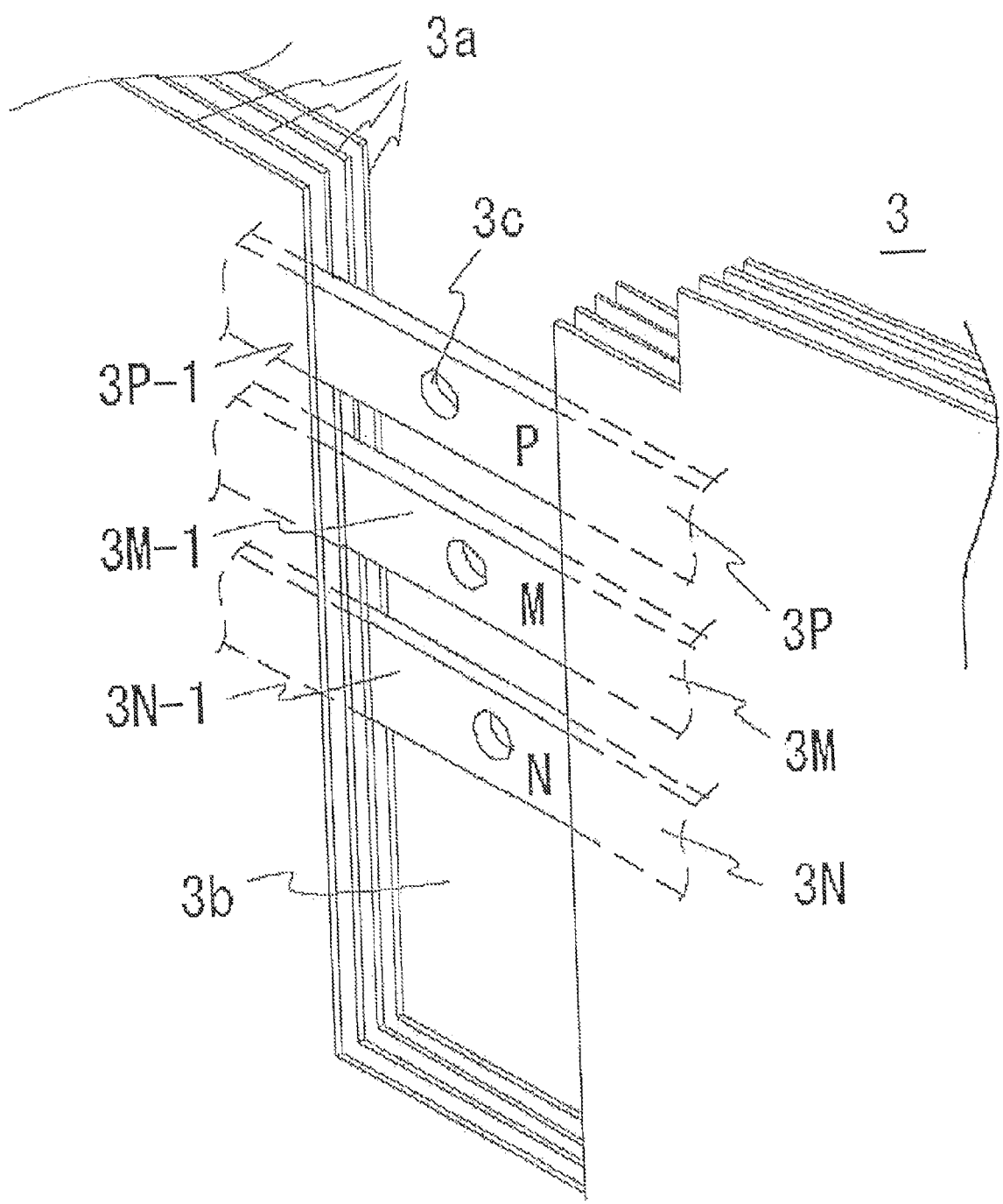
FIG. 7 is an enlarged view of the connection terminal section in the laminated bus bar having a conventional structure shown in FIGS. 4(a) and FIG. 4(b).

Now the invention will be described in detail below with reference to the accompanied drawings which illustrate the preferred embodiments of the invention. In the following descriptions and the drawings which illustrate the preferred embodiments, the same reference numerals as used in FIGS. 5 through 7 are used to designate the same constituent elements and their duplicated descriptions are not made for the sake of simplicity.

Laminated bus bar 3 according to the invention is fundamentally the same with the conventional laminated bus bar. Laminated bus bar 3 according to the invention is different from the conventional laminated bus bar in that grooves of creepage (hereinafter referred to as "creepage grooves") 3d are formed on the edges of insulator plates 3a corresponding to connection terminal sections 3P-1, 3M-1, and 3N-1. Connection terminal sections 3P-1, 3M-1, and 3N-1 are led out in parallel to each other into terminal-leading-out-window 3b of insulator plates 3a.

Figure 1A:
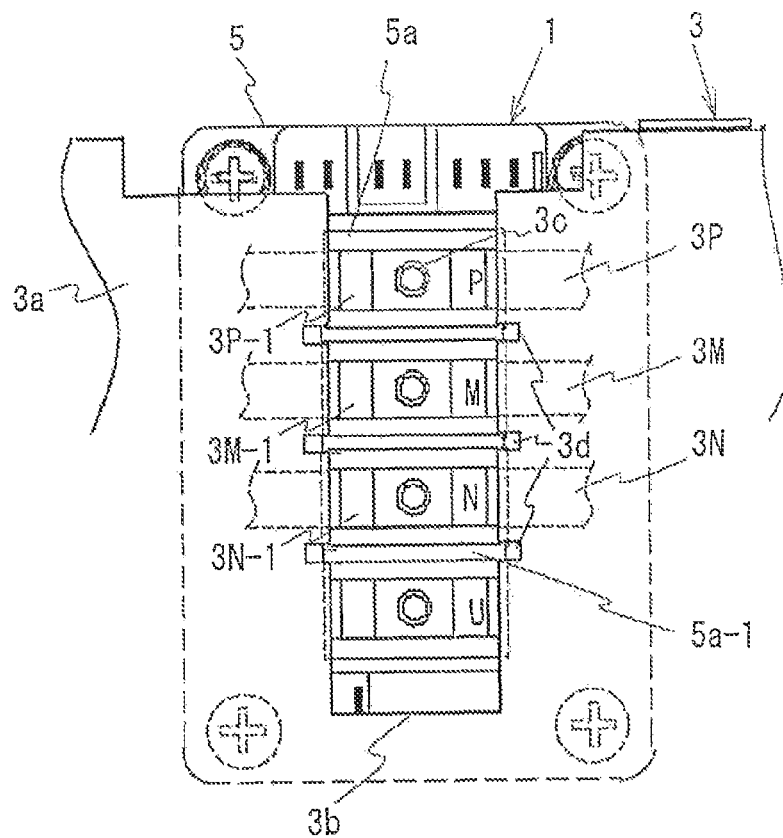
FIG. 1(a) is a top plan view of the semiconductor module, onto which a laminated bus bar according to the invention is connected.
Figure 1B:
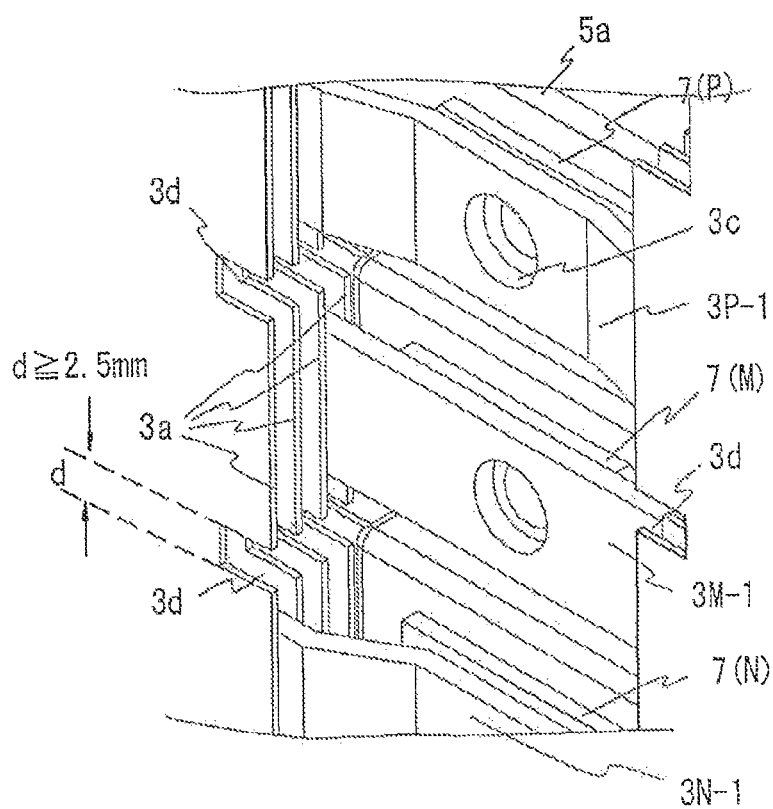
FIG. 1(b) is a perspective view of the laminated bus bar on the semiconductor module shown in FIG. 1(a).
Figure 2:
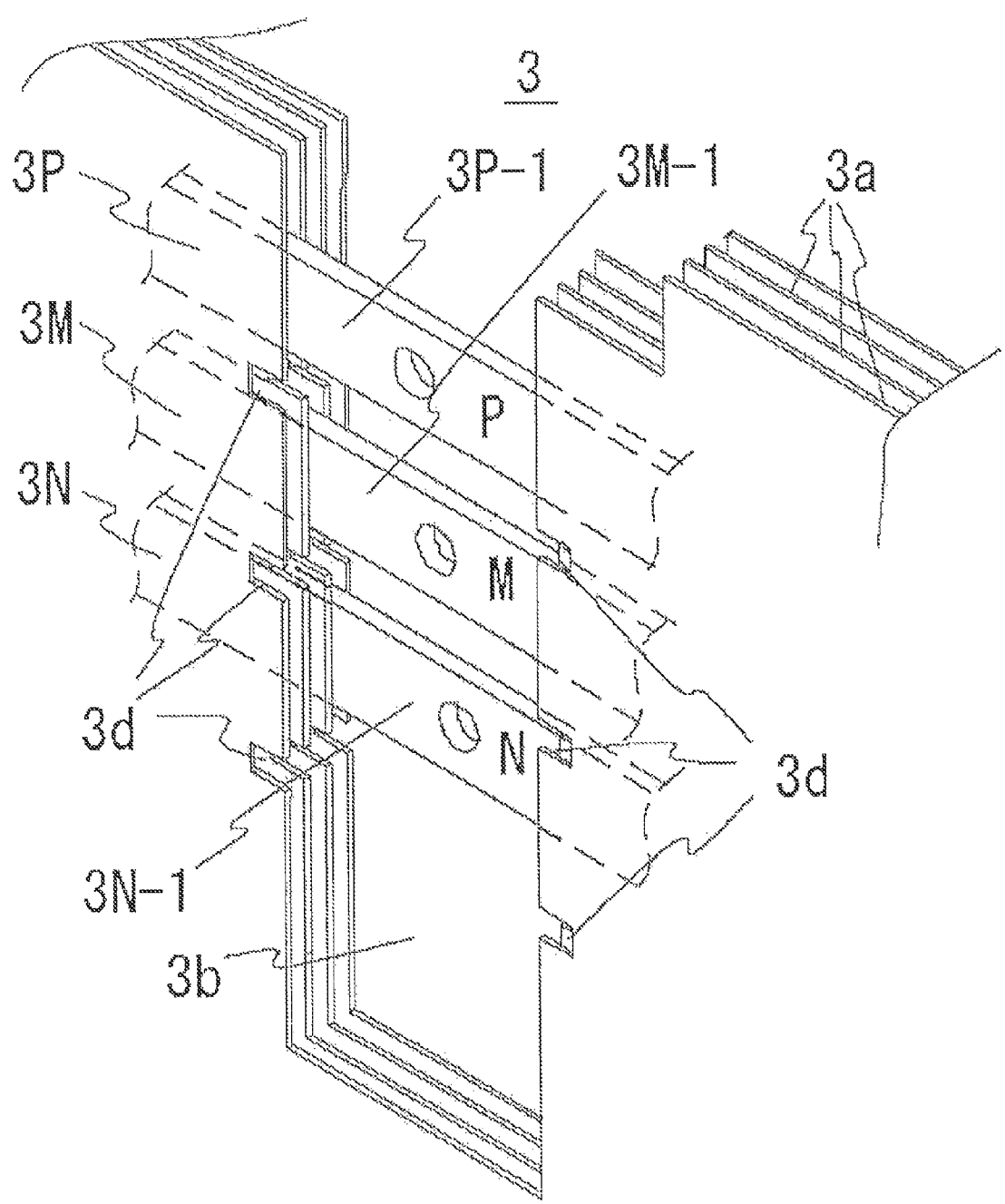
FIG. 2 is a perspective view of the laminated bus bar according to the invention.

In detail, creepage grooves 3d are formed at the positions on the edges of insulator plates 3a corresponding to the midpoint between connection terminal sections 3P-1 and 3M-1, the midpoint between connection terminal sections 3M-1 and 3N-1, and the position below connection terminal section 3N-1 facing the midpoint between connection terminal sections 3M-1 and 3N-1 across connection terminal section 3N-1. In other words, creepage grooves 3d are formed at the positions on the edges of insulator plates 3a corresponding to trenches 5a-1 formed between main circuit terminals 7 and across terminal board 5a on IGBT module 1 (FIGS. 1(a), 1(b) and 2).

Creepage groove 3d is parallel-sided. The width d of creepage groove 3d is set to be equal to or more than 2.5 mm wide so that the width d may meet the minimum groove width x (x=2.5 mm) specified by the international Standard IEC60077-1. The depth of creepage groove 3d is set to be from 2 to 10 mm. In manufacturing insulator plate 3a of laminated bus bar 3, creepage grooves 3d are formed easily by punching with a cutting die having cutter edges placed side by side.

Figure 3:
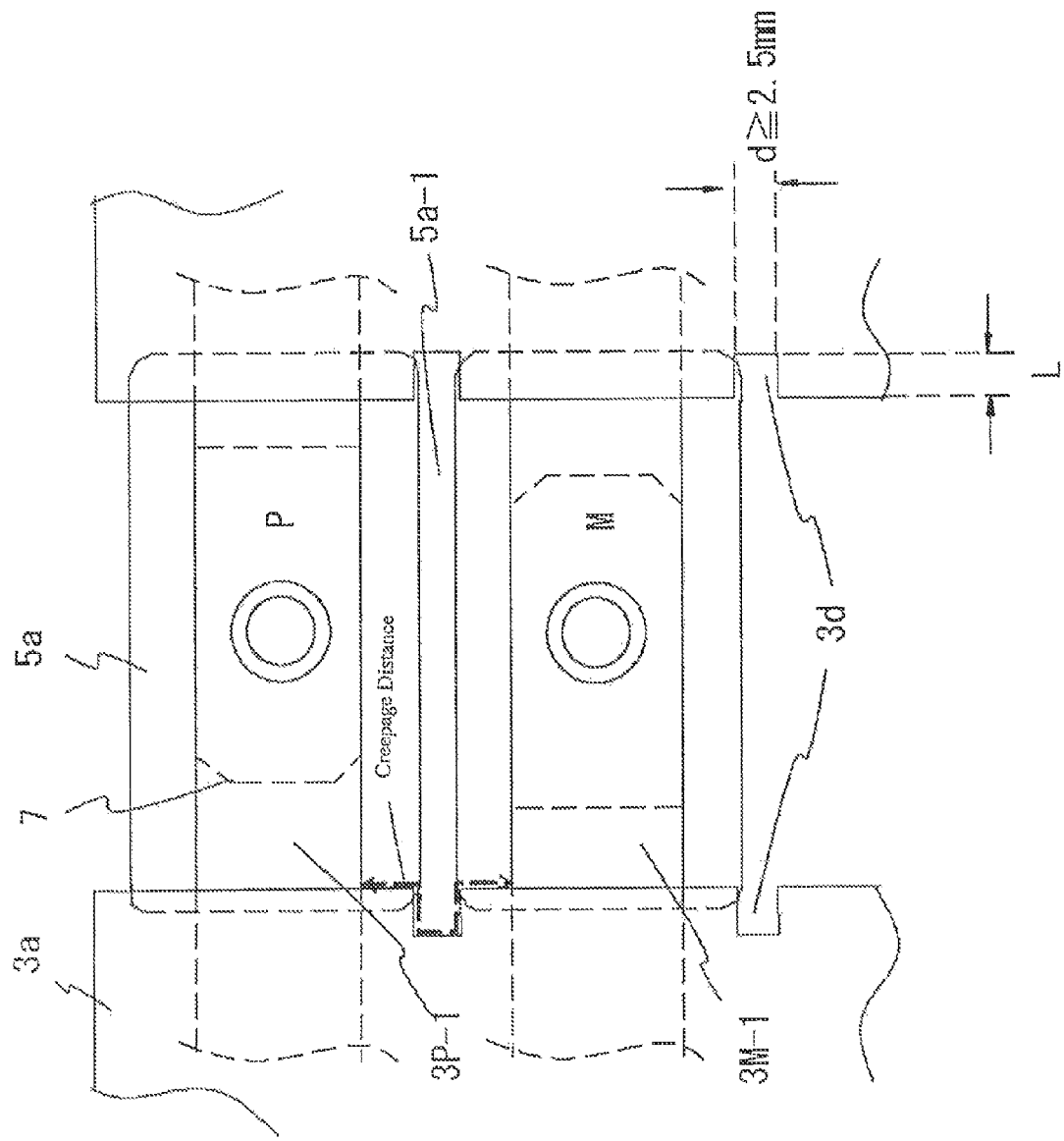
FIG. 3 is a schematic drawing illustrating the creepage distance between the conductor terminals of the laminated bus bar shown in FIGS. 1(a) and 1(b).
Figure 4A:
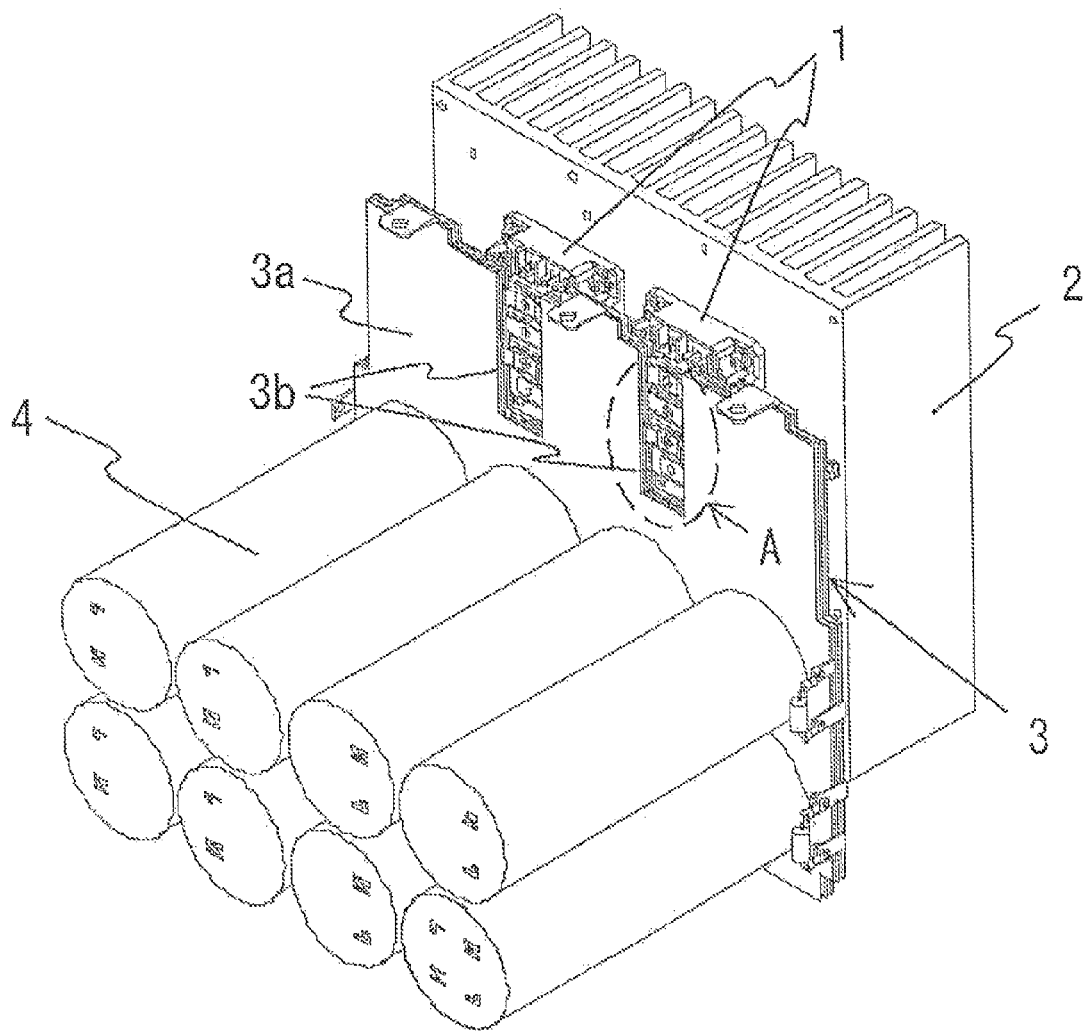
FIG. 4(a) is a perspective view describing the assembly of an inverter unit that employs a laminated bus bar having a conventional structure.
Figure 4B:
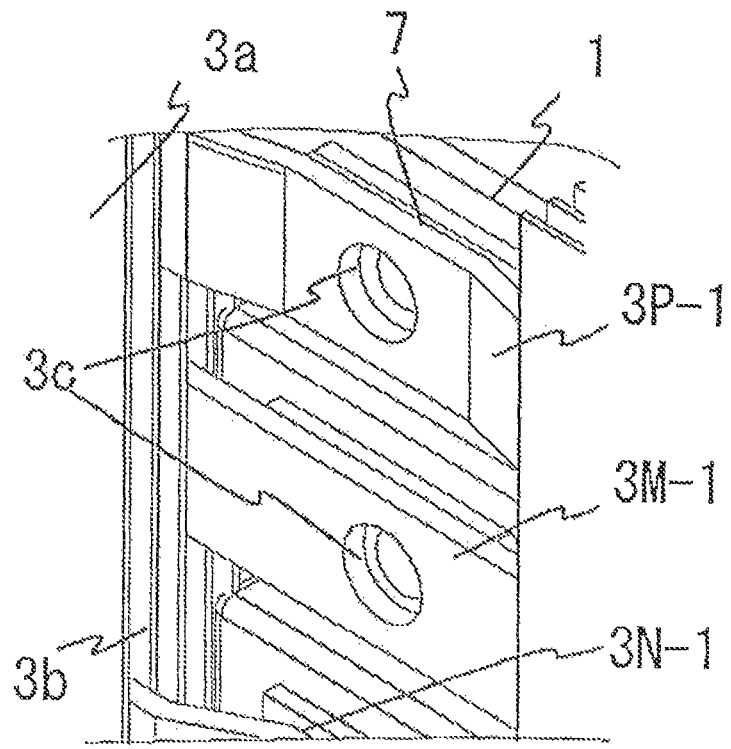
FIG. 4(b) is an enlarged view of portion A in FIG. 4(a).

Laminated bus bar 3 according to the invention includes insulator plates 3a, each including creepage grooves 3d formed on the edges thereof by a few additional work. In the state, in which laminated bus bar 3 according to the invention is connected to main circuit terminals 7 of IGBT module 1, the creepage distance between connection terminal section 3P-1 shown in FIG. 3 and connection terminal section 3M-1 adjoining to connection terminal section 3P-1 with insulator plate 3a interposed between connection terminal sections 3P-1 and 3M-1 is equal to the distance via the inner surface of creepage groove 3d.

Figure 8:
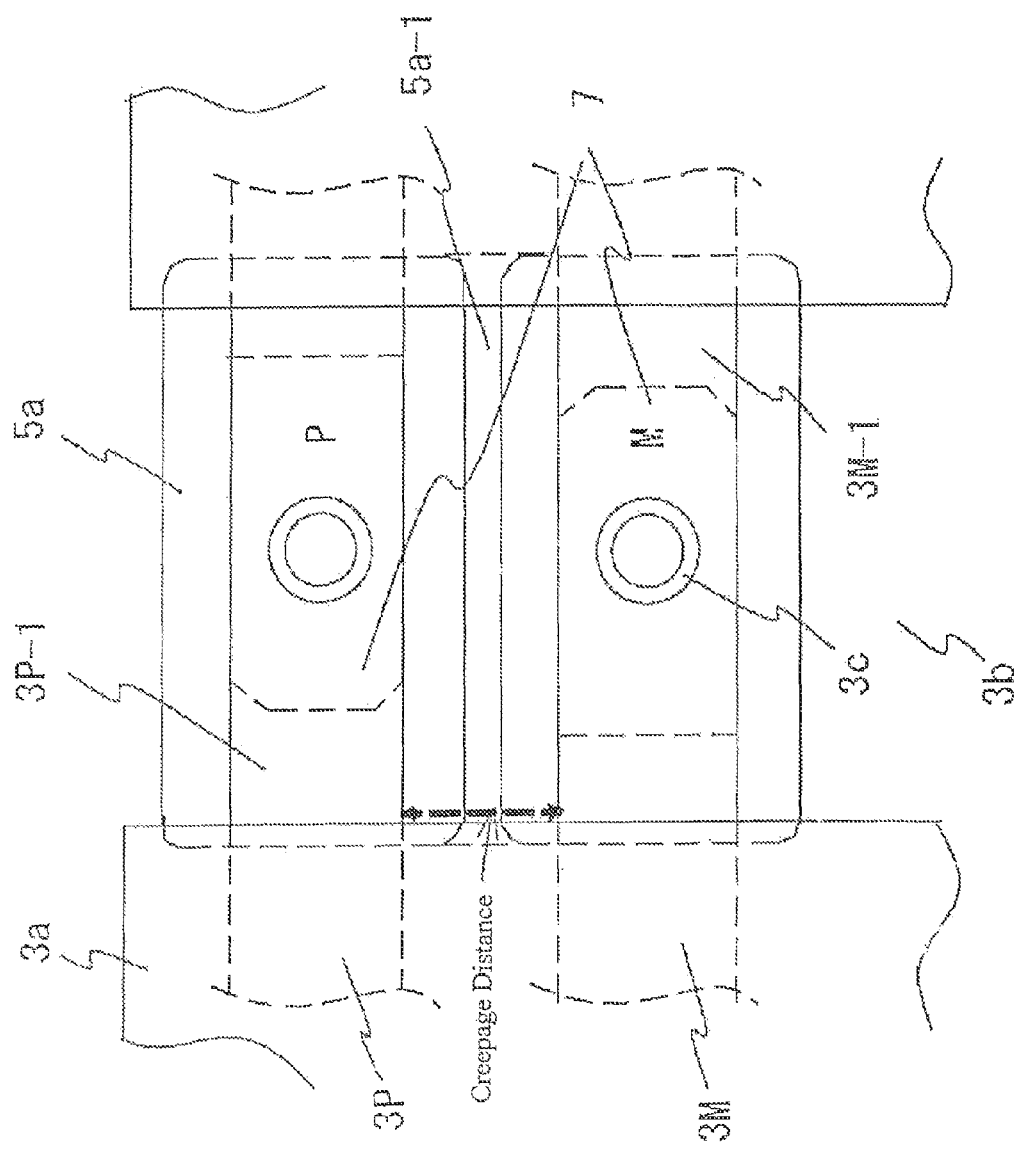
FIG. 8 is a schematic drawing illustrating the creepage distance between the conductor terminals of the laminated bus bar shown in FIGS. 4(a) and FIG. 4(b).

Therefore, the creepage distance in the laminated bus bar according to the invention is longer than the creepage distance in the laminated bus bar having the conventional structure shown in FIG. 8. Due to the laminated bus bar structure according to the invention, the insulation distance (creepage distance, clearance distance) equal to the insulation distance between main circuit terminals 7 arranged on terminal board 5a is secured and the insulation performances of the laminated bus bar are improved. By setting the width d of creepage groove 3d to be equal to or more than 2.5 mm wide, the laminated bus bar according to the invention is applicable to the electric power converters for the rolling stock.

Although the illustrated example has been described in connection with the inverter unit that employs the laminated bus bar to the wiring circuit of an IGBT module, the laminated bus bar according to the invention is applicable to various kinds of semiconductor devices other than the IGET modules. As for the connection terminal section of the laminated bus bar, the same effects will be obtained, if the terminal-leading-out-window is not formed in the insulator plate but the connection terminal section is led out from the outer edge of the insulator plate and arranged outside the insulator plate.

The disclosure of Japanese Patent Application No. 2010-139730 filed on. Jun. 18, 2010 is incorporated as a reference.

While the invention has been explained with reference to the Specific embodiment of the invention, the explanation is illustrative and the invention is limited only by the appended claims.

What is claimed is:

1. A laminated bus bar applied to a main wiring circuit of an electric power converter and connected to a semiconductor module, comprising:

insulator plates laminated together and having terminal windows aligned together when the insulator plates are laminated, and conductors interposed between the insulator plates, each conductor including a connection terminal section led out in accordance with an arrangement of a main circuit terminal on the semiconductor module, one conductor being interposed between two of the insulator plates and another conductor being interposed between two of the insulator plates such that the one and another conductors are not interposed between same insulator plates, and are laterally and vertically spaced from each other, wherein creepage grooves are formed in the entire insulator plates to extend linearly from side edges of the terminal windows of the insulator plates in accordance with a position between the connection terminal sections, said creepage grooves being arranged between two adjacent conductors such that the creepage grooves align linearly throughout the entire insulator plates when the insulator plates are laminated.

2. The laminated bus bar according to claim 1, wherein the creepage groove is parallel-sided, and the groove of creepage has an opening width set to be equal to or more than 2.5 mm wide.

3. The laminated bus bar according to claim 1, wherein the side edges of the terminal windows are arranged parallel to each other, the conductors being arranged parallel to each other between the side edges so that the conductors do not overlap each other.

4. The laminated bas bar according to claim 3, wherein the creepage groove on one side of the side edge faces the creepage groove on the other side of the side edge.

5. The laminated bas bar according to claim 3, wherein four insulator plates are laminated together to interpose three conductors between two of the insulator plates.

* * * * *